(12) United States Patent
Doyle et al.

(10) Patent No.: US 9,872,398 B1
(45) Date of Patent: Jan. 16, 2018

(54) IMPLEMENTING BACKDRILLING ELIMINATION UTILIZING VIA PLUG DURING ELECTROPLATING

(71) Applicant: International Business Machines Corporation, Armonk, NY (US)

(72) Inventors: Matthew S. Doyle, Chatfield, MN (US); Joseph Kuczynski, North Port, FL (US); Phillip V. Mann, Rochester, MN (US); Kevin M. O'Connell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/231,515

(22) Filed: Aug. 8, 2016

(51) Int. Cl.
| | |
|---|---|
| *H01K 3/10* | (2006.01) |
| *H05K 3/42* | (2006.01) |
| *H05K 3/00* | (2006.01) |
| *H05K 1/11* | (2006.01) |
| *H05K 1/02* | (2006.01) |

(52) U.S. Cl.
CPC .............. *H05K 3/42* (2013.01); *H05K 1/0216* (2013.01); *H05K 1/115* (2013.01); *H05K 3/0047* (2013.01); *H05K 2201/0959* (2013.01); *H05K 2201/09218* (2013.01); *H05K 2201/09545* (2013.01); *Y10T 29/49165* (2015.01)

(58) Field of Classification Search
CPC ......... Y10T 29/49155; Y10T 29/49124; Y10T 29/49126; Y10T 29/49117; Y10T 29/49165

USPC .......... 29/852, 829, 830, 831, 832, 846, 847
See application file for complete search history.

(56) References Cited

U.S. PATENT DOCUMENTS

| | | | |
|---|---|---|---|
| 6,264,862 B1* | 7/2001 | Liaw .............. | B29C 39/10 264/102 |
| 6,541,712 B1* | 4/2003 | Gately ........... | H05K 1/115 174/258 |
| 6,700,078 B2 | 3/2004 | Farquhar et al. | |
| 6,989,606 B2 | 1/2006 | Cheng et al. | |
| 8,230,592 B2 | 7/2012 | Kuczynski et al. | |
| 8,528,203 B2 | 9/2013 | Balcome et al. | |
| 2008/0025007 A1 | 1/2008 | Ao | |
| 2012/0211273 A1 | 8/2012 | Kuczynski et al. | |
| 2015/0131250 A1 | 5/2015 | Isaacs | |

FOREIGN PATENT DOCUMENTS

JP          2005227322          8/2005

\* cited by examiner

*Primary Examiner* — Thiem Phan
(74) *Attorney, Agent, or Firm* — Joan Pennington

(57) ABSTRACT

A method and structure are provided for implementing enhanced via creation without creating a via barrel stub. The need to backdrill during printed circuit board (PCB) manufacturing is eliminated. After the vias have been drilled, but before plating, a via plug with a specialized geometry and including a capillary is inserted into each via to allow electroplating on only preferred wall surfaces of the vias. Then a board plating process of the PCB manufacturing is performed.

12 Claims, 2 Drawing Sheets

IMPLEMENTING BACKDRILLING ELIMINATION UTILIZING VIA PLUG DURING ELECTROPLATING

FIELD OF THE INVENTION

The present invention relates generally to the data processing field, and more particularly, relates to a method and structure for implementing manufacture of a printed circuit board (PCB) with enhanced via creation without creating a via barrel stub, eliminating the need to back-drill.

DESCRIPTION OF THE RELATED ART

The computer hardware development industry has reached a point wherein many computer interfaces are of sufficient switching speed as to require signal routing layer change vias to be back-drilled to remove via barrel stubs. Backdrilling is a conventional technique used to remove the via barrel stub. Without removal of the unnecessary section or length of a via barrel, some amount of the propagating signal is reflected away from the intended receiver, thereby significantly reducing the amount of total energy effectively transferred from driver to receiver.

While there are known processes to mechanically remove these stubs, once back-drilled, it is no longer possible to probe those locations on the printed circuit board (PCB), cost of the PCB increases substantially, and success of the process is statistically less than ideal. These facts significantly complicate our ability to manufacture cost-effective PCBs, measure high-speed interfaces in the lab during system bring-up and model-to-hardware correlation activities, and maximize the electrical performance of our computer interfaces. When system errors occur in the field, the field engineer cannot measure and confirm function at these PCB via locations while at the customer's site.

A need exists for a method and structure for implementing via creation that eliminates creation of a via barrel stub, eliminating the need to back-drill, reducing PCB cost, and maximizing interface margin.

As used in the following description and claims, the term printed circuit board (PCB) should be understood to broadly include a printed wiring board or other substrate, an interconnect substrate, and various substrates including a plurality of insulator layers, and internal conductive traces.

SUMMARY OF THE INVENTION

Principal aspects of the present invention are to provide a method and structure for implementing manufacture of a printed circuit board (PCB) with enhanced via creation without creating a via barrel stub, eliminating the need to back-drill. Other important aspects of the present invention are to provide such method and structure substantially without negative effects and that overcome many of the disadvantages of prior art arrangements.

In brief, a method and structure are provided for implementing enhanced via creation without creating a via barrel stub. The need to backdrill during printed circuit board (PCB) manufacturing is eliminated. After the vias have been drilled, but before plating, a via plug with a specialized geometry and including a capillary is inserted into each via to allow electroplating on only preferred wall surfaces of the vias. Then a board plating process of the PCB manufacturing is performed.

In accordance with features of the invention, the via plugs are formed of a selected electrically insulating material.

In accordance with features of the invention, the via plug with the capillary prevents the electroplating from creating via barrel stubs, thus eliminating the need to backdrill each via after the plating process.

In accordance with features of the invention, the via plugs advantageously have beneficial effects on signal integrity and noise reduction due to their insulative properties and the via plugs remain in the board after plating In accordance with features of the invention, eliminating back-drilling improves yield and late fail discoveries, both of which can improve cost and reliability of boards.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structure are provided for implementing enhanced via creation without creating a via barrel stub. The need to backdrill vias during printed circuit board (PCB) manufacturing is eliminated. After the vias have been drilled, but before plating, a via plug is inserted into each via. The via plug has a specialized geometry and a capillary allowing electroplating on only the preferred surfaces of the via.

In accordance with features of the invention, the PCB plating process is performed using a conventional plating process. Conventional PCB finishing processes are performed, advantageously eliminating the need to backdrill each via after the plating process.

In accordance with features of the invention, the via plug is formed of a selected electrically insulating material.

In accordance with features of the invention, an arrayed tool optionally is used to insert multiple plugs or groups of plugs all at once. The via plugs provide enhanced signal integrity and noise reduction due to their electrically insulative properties and the via plugs optionally remain in the board after plating.

Figure 1:
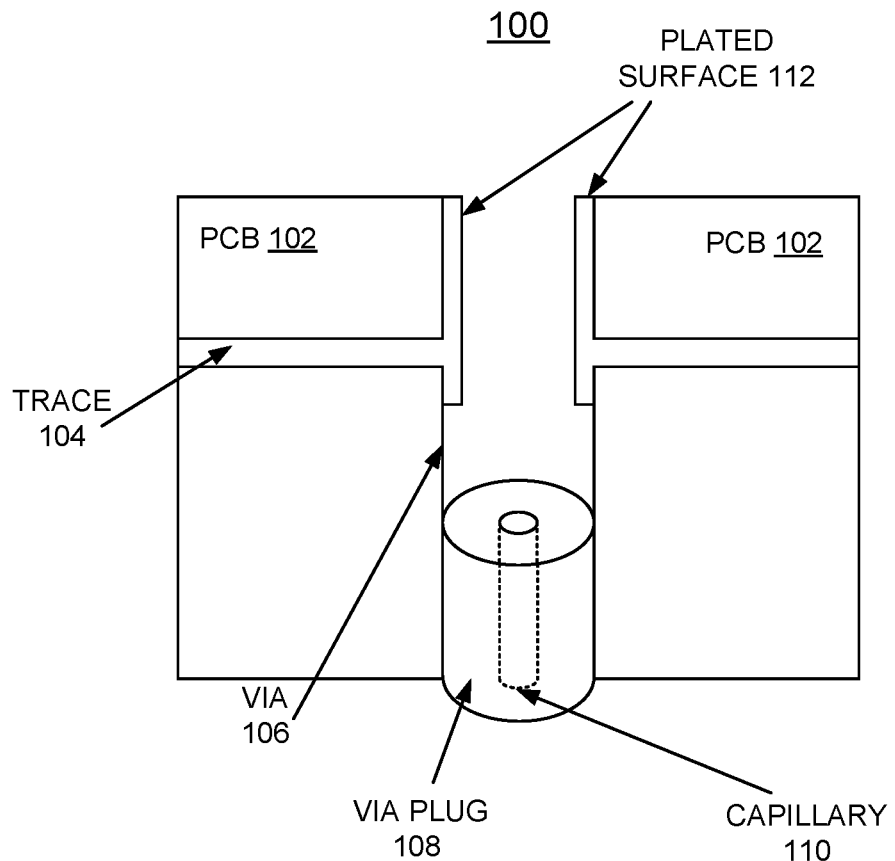
FIG. 1 illustrates an example structure for manufacturing a printed circuit board (PCB) with enhanced via creation without creating a via barrel stub, eliminating the need to back-drill in accordance with the preferred embodiment.

Having reference now to the drawings, in FIG. 1, there is shown an example structure generally designated by reference character 100 for manufacturing a printed circuit board (PCB) with enhanced via creation without creating a via barrel stub, eliminating the need to back-drill in accordance with the preferred embodiment.

Structure 100 includes a printed circuit board (PCB) 102 having an internal conductive or signal trace 104. PCB 102 includes an insulator substrate or insulator layers, with one or more internal conductive traces 104. Structure 100 includes a via 106 extending through the printed circuit board (PCB) 102 and the internal conductive trace 104. Structure 100 includes a via plug 108 including a capillary 110 extending through the via plug. The via plug 108 with the capillary 110 eliminates via barrel stub creation during a PCB plating process during PCB manufacturing.

The via plug 108 is formed of an electrically insulating material having sufficient strength and rigidity for insertion into the via 106. The via plug 108 has a specialized geometry and a capillary 110 allowing electroplating on only the preferred surfaces of the via. The via plug 108 has a specialized geometry conforming to the via 106 enabling the via plug to be slidingly received within the via 106. As shown, the via plug 108 is a cylindrical via plug fabricated with a capillary 110 such that when plugged into a via 106, the via plug allows full electroplating of the inner surface of the via, but prevents any excessive plating that would reduce signal integrity. The via plug 108 presents an inexpensive and quick method of improving a boards signal performance while also reducing the amount of electroplating required.

The via plug 108 with the capillary 110 prevents the PCB plating process from creating via barrel stubs, thus eliminating the need to backdrill each via after the plating process. Eliminating back-drilling improves yield and late fail discoveries, both of which can improve cost and reliability of boards.

In accordance with features of the invention, the printed circuit board (PCB) 102 and via 106 are formed generally including standard PCB manufacturing processes, including via drilling and plating. However, the step of back-drilling at the end is removed and the PCB process of the invention provides that after the vias 106 have been drilled, but before plating, a small via plug 108 is inserted into each via 106. The PCB 102 is then sent through the normal plating process. The via plug 108 prevents the plating from taking hold in the area that via plug 108 occupies, and eliminates creation of the via barrel stub eliminating the need to backdrill each via after the plating process.

Figure 2:
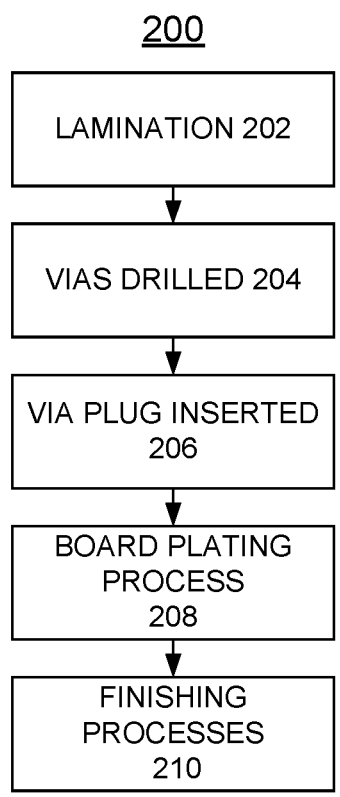
FIG. 2 is a flow chart illustrating example steps for implementing a structure embodying the enhanced via creation without creating a via barrel stub in accordance with the preferred embodiment.

Referring now to FIG. 2, there is shown a flow chart illustrating example steps generally designated by reference character 200 for implementing a structure embodying the enhanced via creation without creating a via barrel stub in accordance with the preferred embodiment starting at a block 202.

As indicated at a block 202, a lamination is formed defining the PCB 102 and at least one internal conductive traces 104.

As indicated at a block 204, vias 106 are drilled. Conventional via drilling is performed.

As indicated at a block 206, the via plugs 108 having the capillary are inserted into the vias 106. The capillary 110 in via plug 108 provides a region for any fluid to escape and proper filling of the via hole 106, preventing any electroplating from crossing in to the undesirable regions of the via 106 and PCB 102, and eliminates creation of the via barrel stub.

As indicated at a block 208, the PCB plating process is performed, using a conventional plating process. It should be understood that either the via plugs 108 remain in the PCB 102 or optionally are removed after the PCB plating process is performed.

As indicated at a block 210, conventional PCB finishing processes are performed, advantageously eliminating the need to backdrill each via after the plating process.

In accordance with features of the invention, the alternative method for via creation eliminates creation of the via barrel stub. Since the via barrel stub is not created, the need to back-drill is eliminated, reducing PCB cost and maximizing interface margin.

While the present invention has been described with reference to the details of the embodiments of the invention shown in the drawing, these details are not intended to limit the scope of the invention as claimed in the appended claims.

What is claimed is:

1. A method for implementing enhanced via creation without creating a via barrel stub during printed circuit board (PCB) manufacturing comprising:
   providing a printed circuit board (PCB); said printed circuit board (PCB) having an internal conductive trace;
   forming a via extending through the printed circuit board (PCB) including the internal conductive trace;
   inserting a via plug into the via, said via plug having a capillary extending through said via plug; and
   performing PCB plating.

2. The method as recited in claim 1 includes said via plug remaining in the PCB via after PCB plating.

3. The method as recited in claim 1 includes providing enhanced signal integrity with said via plug.

4. The method as recited in claim 1 includes providing enhanced noise reduction with said via plug.

5. The method as recited in claim 1 includes forming with said via plug with a selected electrically insulating material.

6. The method as recited in claim 1 wherein inserting a via plug into the via includes slidingly inserting said via plug into the via.

7. The method as recited in claim 1 includes forming with said via plug with a specialized geometry and capillary conforming to the via.

8. The method as recited in claim 1 wherein providing a printed circuit board (PCB); said printed circuit board (PCB) having an internal conductive trace includes a standard PCB manufacturing process.

9. The method as recited in claim 1 wherein inserting said via plug into the via includes providing an arrayed tool used to insert multiple ones of said via plugs at once.

10. The method as recited in claim 1 includes performing a standard PCB plating process responsive to inserting the via plug.

11. The method as recited in claim 1 includes performing conventional PCB finishing processes with aid via plug remaining in the PCB via after PCB plating.

12. The method as recited in claim 1 wherein eliminating via back-drilling enables improved yield and reliability of the PCB.

* * * * *